(12) United States Patent
Lee et al.

(10) Patent No.: US 9,647,241 B2
(45) Date of Patent: May 9, 2017

(54) ORGANIC LIGHT EMITTING DIODE DISPLAY HAVING MULTI-LAYER STACK STRUCTURE

(71) Applicant: LG DISPLAY CO., LTD., Seoul (KR)

(72) Inventors: Hoyoung Lee, Paju-si (KR); Joonki Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/975,075

(22) Filed: Dec. 18, 2015

(65) Prior Publication Data

US 2016/0190521 A1 Jun. 30, 2016

(30) Foreign Application Priority Data

Dec. 30, 2014 (KR) ................... 10-2014-0194440

(51) Int. Cl.
*H01L 51/52* (2006.01)
*H01L 27/32* (2006.01)

(52) U.S. Cl.
CPC ........ *H01L 51/5278* (2013.01); *H01L 27/326* (2013.01); *H01L 27/3209* (2013.01); *H01L 27/3246* (2013.01)

(58) Field of Classification Search
CPC  H01L 27/3209; H01L 27/326; H01L 51/5278
See application file for complete search history.

(56) References Cited

U.S. PATENT DOCUMENTS

| 5,994,835 | A * | 11/1999 | Wilson ..................... G02B 6/42 313/499 |
| 2013/0048954 | A1* | 2/2013 | Lee ..................... H01L 51/5221 257/40 |
| 2013/0082247 | A1* | 4/2013 | Kawata ............... H01L 51/5209 257/40 |
| 2013/0119357 | A1* | 5/2013 | Kim ..................... H01L 51/5048 257/40 |
| 2015/0214498 | A1* | 7/2015 | Ichikawa .............. H01L 51/504 257/40 |
| 2016/0240810 | A1* | 8/2016 | Oh ....................... H01L 51/5228 |

\* cited by examiner

*Primary Examiner* — Allan R Wilson
(74) *Attorney, Agent, or Firm* — Dentons US LLP

(57) ABSTRACT

An organic light-emitting diode (OLED) display comprises, an anode electrode disposed over a substrate; a cathode electrode disposed opposite the anode electrode; a charge generation layer disposed between the anode electrode and the cathode electrode; a first stack disposed between the charge generation layer and the cathode electrode and configured to comprise a first organic light-emitting layer, a first common layer disposed over the first organic light-emitting layer, and a second common layer disposed under the first organic light-emitting layer; and a second stack disposed between the charge generation layer and the anode electrode, wherein at least one of the first common layer and the second common layer covers a sidewall of the charge generation layer.

12 Claims, 6 Drawing Sheets

ORGANIC LIGHT EMITTING DIODE DISPLAY HAVING MULTI-LAYER STACK STRUCTURE

CROSS-REFERENCE TO RELATED APPLICATION

This application claims the priority benefit of Korean Patent Application No. 10-2014-0194440 filed on Dec. 30, 2014, which is incorporated herein by reference for all purposes as if fully set forth herein.

BACKGROUND OF THE INVENTION

Field of the Invention

The present invention relates to an organic light-emitting diode (OLED) display having a multi-layer stack structure. More particularly, the present invention relates to an OLED display having a multi-layer stack structure, which improves a screen abnormality phenomenon in the outskirt part of a panel by preventing a direct contact between a charge generation layer disposed between stack structures and a cathode electrode disposed to cover the stack structures.

Discussion of the Related Art

A variety of types of flat display devices to replace a bulky cathode ray tube (CRT) are recently developed. The flat display devices include a liquid crystal display (LCD), a plasma display panel (PDP), an electrophoretic display (EPD), and an organic light-emitting display (OLED). The OLED display of the flat display devices is a self-light emission device emitting light itself and is advantageous in terms of high response speed, high emission efficiency, high brightness, and a great viewing angle.

FIG. 1 is a diagram showing the structure of an OLED. As shown in FIG. 1, the OLED includes an organic electric field light-emitting compound layer configured to perform electric field light emission and a cathode electrode and an anode electrode disposed with the organic electric field light-emitting compound layer interposed therebetween. The organic electric field light-emitting compound layer includes a light emission layer EML and may further include a hole injection layer HIL, a hole transport layer HTL, an electron transport layer ETL, and an electron injection layer EIL.

The OLED emits light due to energy from excitons which are formed in an excitation process when holes and electrons injected into the anode electrode and the cathode electrode are recombined in the light emission layer EML. The OLED display displays an image by electrically controlling the amount of light generated from the light emission layer EML of an OLED, such as that of FIG. 1.

An OLED display using the characteristics of an OLED includes a passive matrix type OLED display and an active matrix type OLED display.

The active matrix type OLED display displays an image by controlling an electric current flowing into an OLED using a thin film transistor (hereinafter referred to as a "TFT").

FIG. 2 is an example of an equivalent circuit showing the structure of a single pixel in an active matrix type OLED display. FIG. 3 is a plan view showing the structure of a single pixel in the active matrix type OLED display. FIG. 4 is a cross-sectional view taken alone line I-I' of FIG. 3 and shows the structure of the active matrix type OLED display.

Referring to FIGS. 2 to 4, the active matrix OLED display includes a switching TFT ST, a driving TFT DT connected to the switching TFT, and an OLED connected to the driving TFT DT. The TFT of FIG. 4 has been illustrated as being a TFT of a bottom gate method, but is not limited thereto. For example, the TFT may be a TFT having a different structure, such as a top gate method.

The switching TFT ST is formed at a portion in which a scan line SL and a data line DL intersect. The switching TFT ST functions to select a pixel. The switching TFT ST includes a gate electrode SG, a semiconductor layer SA, a source electrode SS, and a drain electrode SD branched from the scan line SL. Furthermore, the driving TFT DT functions to drive the OLED of a pixel selected by the switching TFT ST. The driving TFT DT includes a gate electrode DG connected to the drain electrode SD of the switching TFT ST, a semiconductor layer DA, a source electrode DS connected to a driving current line VDD, and a drain electrode DD. The drain electrode DD of the driving TFT DT is connected to the anode electrode ANO of the OLED. An organic light-emitting layer OLE is interposed between the anode electrode ANO and a cathode electrode CAT. The cathode electrode CAT is connected to a ground voltage VSS. An auxiliary capacitor Cst is disposed between the gate electrode DG of the driving TFT DT and the driving current line VDD or between the gate electrode DG of the driving TFT DT and the drain electrode DD of the driving TFT DT.

More specifically, the gate electrodes SG and DG of the switching TFT ST and the driving TFT DT are formed on the substrate SUB of the active matrix OLED display. Furthermore, a gate insulating layer GI is covered on the gate electrodes SG and DG. Semiconductor layers SA and DA are formed in part of the gate insulating layer GI overlapping with the gate electrodes SG and DG. The source electrodes SS and DS and the drain electrodes SD and DD are formed on the semiconductor layers SA and DA at specific intervals and are configured to face each other. The drain electrode SD of the switching TFT ST comes in contact with the gate electrode DG of the driving TFT DT through a contact hole formed in the gate insulating layer GI. A passivation layer PAS covering the switching TFT ST and the driving TFT DT configured as described above is coated on the entire surface.

The substrate in which the thin film transistors DT and DT have been formed does not have a flat surface due to several elements as described above and has many steps. The organic light-emitting layer OLE is able to emit constant and uniform light only when it is formed on a flat surface. In order to make flat a surface of the substrate, an overcoat layer OC is coated on the entire surface of the substrate.

Furthermore, the anode electrode ANO of the OLED is formed on the overcoat layer OC. The anode electrode ANO is connected to the drain electrode DD of the driving TFT DT through a hole formed in the overcoat layer OC and the passivation layer PAS.

The switching TFT ST and the driving TFT DT are formed over the substrate in which the anode electrode ANO has been formed in order to define a pixel area. Furthermore, a bank BANK is formed on an area in which various lines DL, SL, and VDD have been formed. The anode electrode ANO exposed by the bank BANK becomes a light-emitting area. The organic light-emitting layer OLE is formed on the anode electrode ANO exposed by the bank BANK. The cathode electrode CAT is formed on the organic light-emitting layer OLE.

In the case of the OLED display having a top emission type and implementing full colors as shown in FIG. 4, the anode electrode ANO is formed of a reflection electrode. Furthermore, the organic light-emitting layer OLE may be made of an organic substance generating any one of red, green, and blue. Furthermore, the cathode electrode CAT may be coated on the entire surface of the substrate. For example, the organic light-emitting layer OLE may be made of an organic substance generating white light. In this case, the organic light-emitting layer OLE and the cathode electrode CAT may be coated on the entire surface of the substrate. Furthermore, a color filter may be formed on the organic light-emitting layer OLE or the cathode electrode CAT.

In the case of an OLED display having a bottom emission type and implementing full colors, a color filter is further formed between the overcoat layer OC and the passivation layer PAS. The anode electrode ANO may include a transparent conductive substance. In this case, the organic light-emitting layer OLE may be made of an organic substance generating white light. Furthermore, the organic light-emitting layer OLE and the cathode electrode CAT may be coated on the entire surface of the substrate. Accordingly, the OLED display is completed.

Recently, active research is carried out in order to improve current efficiency of an OLED display and to increase the lifespan of a light-emitting device. For example, research is carried out in order to provide an OLED display having high brightness using the same consumption power as that of a prior art device or an OLED display having the same brightness as that of a prior art using lower consumption power.

SUMMARY OF THE INVENTION

An object of the present invention is to provide an OLED display having a multi-layer stack structure in order to improve current efficiency and the lifespan of a device.

Another object of the present invention is to provide an OLED display having a multi-layer stack structure, which improves a screen abnormality phenomenon in the outskirt part of a panel by preventing a direct contact between a charge generation layer disposed between stack structures and a cathode electrode disposed to cover the stack structures.

In one aspect, an organic light-emitting diode (OLED) display comprises, an anode electrode disposed over a substrate; a cathode electrode disposed opposite the anode electrode; a charge generation layer disposed between the anode electrode and the cathode electrode; a first stack disposed between the charge generation layer and the cathode electrode and configured to comprise a first organic light-emitting layer, a first common layer disposed over the first organic light-emitting layer, and a second common layer disposed under the first organic light-emitting layer; and a second stack disposed between the charge generation layer and the anode electrode, wherein at least one of the first common layer and the second common layer covers a sidewall of the charge generation layer.

In another aspect, an organic light-emitting diode (OLED) display comprises, an anode electrode disposed over a substrate; a lower stack disposed over the anode electrode; a charge generation layer disposed over the lower stack; an upper stack disposed over the charge generation layer; a cathode electrode disposed over the upper stack; and a contact blocking unit interposed between the cathode electrode and a sidewall of the charge generation layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention.

Figure 1:
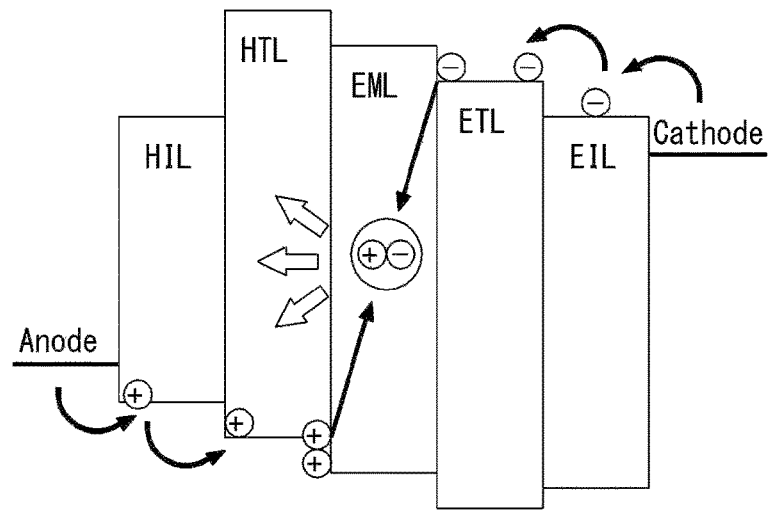
FIG. 1 is a diagram showing the structure of a related art OLED.
Figure 2:
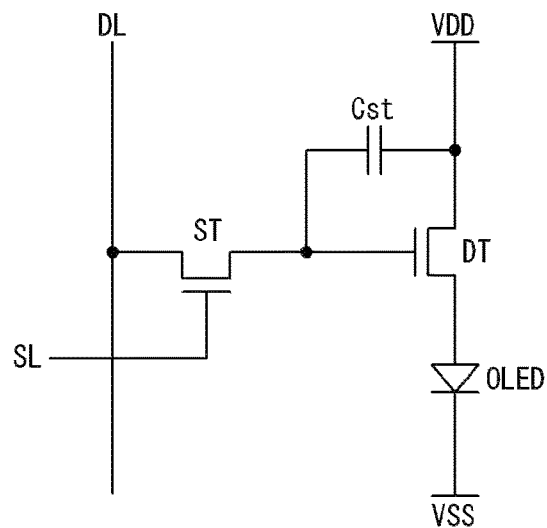
FIG. 2 is an example of an equivalent circuit showing the structure of a single pixel in an active matrix type of a related art OLED display.
Figure 3:
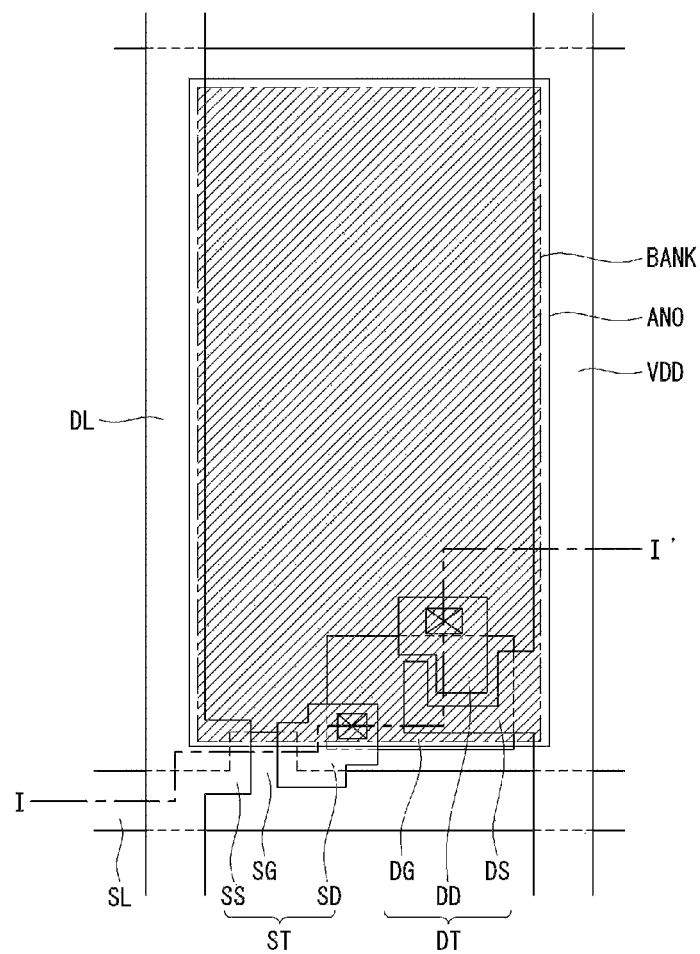
FIG. 3 is a plan view showing the structure of a single pixel in the active matrix type of a related art OLED display.
Figure 4:
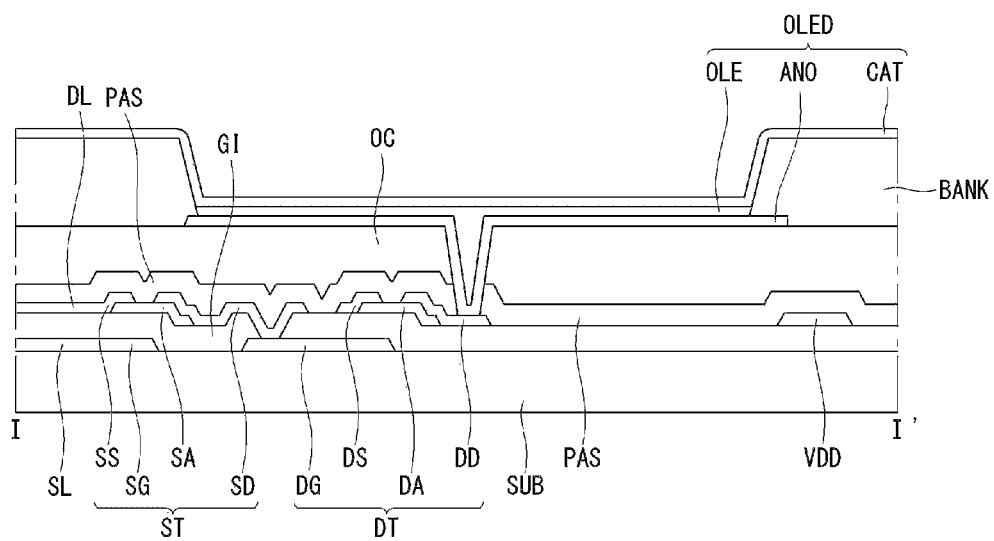
FIG. 4 is a cross-sectional view taken alone line I-I' of FIG. 3 and shows the structure of the active matrix type OLED display.
Figure 5:
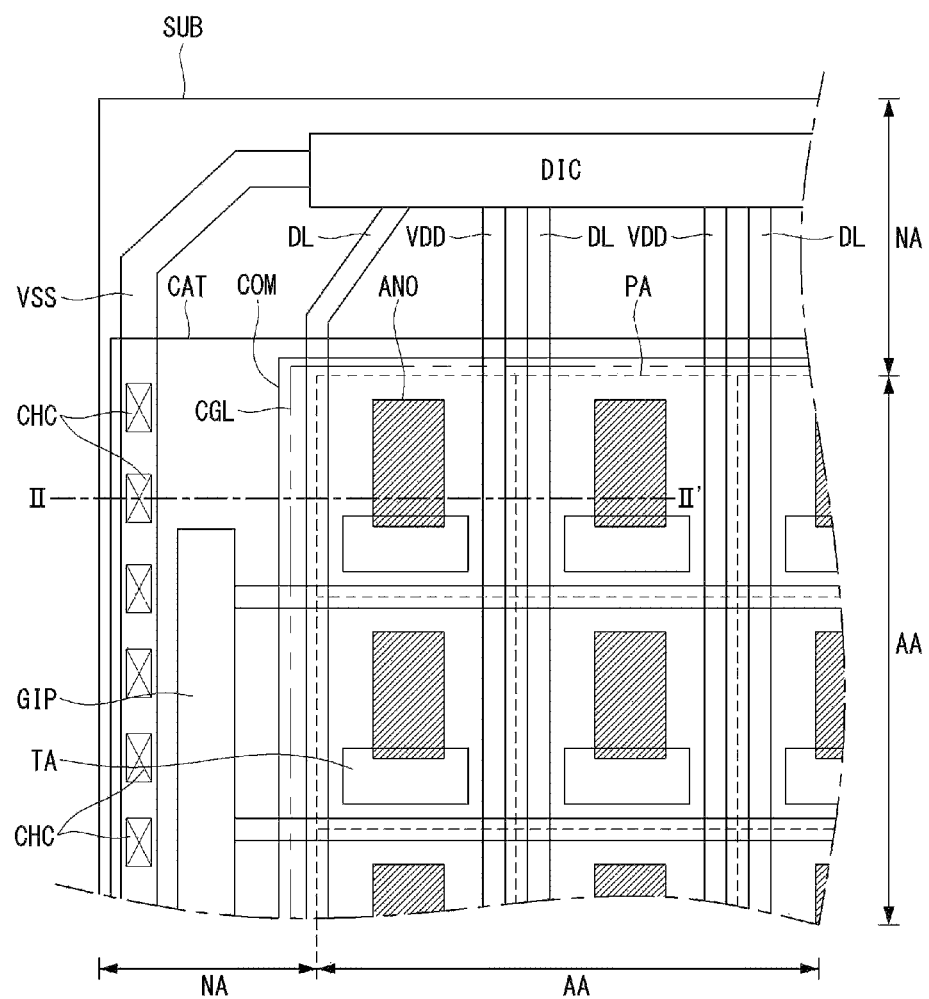
FIG. 5 is a plan view schematically showing an OLED display having a double stack structure according to an embodiment of the present invention.
Figure 6:
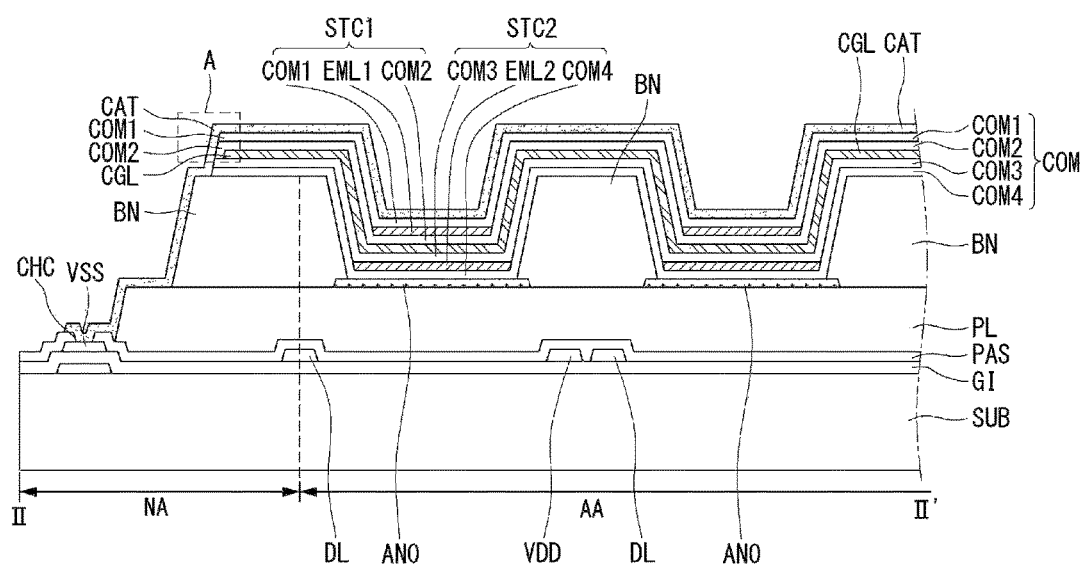
FIG. 6 is a cross-sectional view taken along line II-II' of FIG. 5 and schematically shows the OLED display having a double stack structure according to an embodiment of the present invention.

An OLED display having a double stack structure according to an embodiment of the present invention is described below with reference to FIGS. 5 and 6. FIG. 5 is a plan view schematically showing an OLED display having a double stack structure according to an embodiment of the present invention. FIG. 6 is a cross-sectional view taken along line II-II' of FIG. 5 and schematically shows the OLED display having a double stack structure according to an embodiment of the present invention.

Referring to FIG. 5, the OLED display having a double stack structure according to an embodiment of the present invention includes a substrate SUB in which a display area AA configured to display image information and a non-display area NA configured to have several elements for driving the display area AA disposed therein have been defined.

A data driving unit (or data driving integrated circuit) DIC for supplying data lines DL with a signal corresponding to image information and a gate driving unit (or gate driving integrated circuit) GIP for supplying gate lines GL with a scan signal may be disposed in the non-display area NA. In the case of high resolution in which the number of data lines DL and driving current lines VDD is increased, the data driving unit DIC may be disposed outside the substrate SUB, and data connection pads may be disposed instead of the data driving unit DIC.

In order to simplify the structure of a display device, the gate driving unit GIP may be directly formed on one side of the substrate SUB. Furthermore, a ground line VSS for supplying a ground voltage is disposed in the outmost part of the substrate SUB. The ground line VSS may be disposed so that it receives a ground voltage supplied from the outside of the substrate SUB and supplies the ground voltage to both the data driving unit DIC and the gate driving unit GIP. For example, the ground line VSS is connected to the data driving unit DIC disposed on the upper peripheral part of the substrate SUB and may be disposed to surround the substrate outside the gate driving unit GIP disposed on the left and/or right side of the substrate SUB.

A plurality of pixel areas PA arranged in a matrix manner is defined in the display area AA. For example, the pixel areas PA may be defined in a rectangle form of an M×N method. The pixel areas PA are not necessarily limited to such a method and may be arranged in various ways. The pixel areas PA may have the same size or different sizes. Furthermore, the pixel areas PA, each having three sub-pixels indicative of red, green, and blue (RGB) colors as one unit, may be regularly arranged. For example, in the form of the simplest structure, the pixel areas PA may be defined by the cross structure of the plurality of gate lines GL traveling in a horizontal direction and the plurality of data lines DL and driving current lines VDD traveling in a vertical direction.

An OLED and thin film transistors for driving the OLED, that is, the core elements of the OLED display, are formed in each of the pixel areas PA. The thin film transistors may be formed in a TFT area TA defined on one side of the pixel area PA. The OLED includes an anode electrode ANO, a cathode electrode CAT, and a light-emitting structure interposed between the two electrodes.

The anode electrode ANO is formed to occupy some an within the pixel area PA and is connected to the thin film transistors formed in the TFT area TA. A light-emitting structure is formed on the anode electrode ANO, and the cathode electrode CAT is formed on the light-emitting structure. The cathode electrode CAT is integrated and formed in such a way as to cover at least the area of the display area AA in which the pixel areas PA has been disposed.

The cathode electrode CAT contacts the ground line VSS disposed outside the substrate SUB. That is, a ground voltage is applied to the cathode electrode CAT through the ground line VSS. The cathode electrode CAT is supplied with the ground voltage and the anode electrode ANO is supplied with an image voltage. The light-emitting structure emits light due to a difference between the ground voltage and the image voltage, thereby displaying image information.

As described above, the cathode electrode CAT is configured to cover the entire display area AA so that it comes in contact with the ground line VSS through contact holes CHC through which the ground line VSS is exposed and to extend up to the non-display area NA. In contrast, the light-emitting structure has a smaller area than the cathode electrode CAT.

The light-emitting structure is described in more detail with reference to FIG. 6. A structure until the anode electrode is formed according to an embodiment of the present invention is not limited to the structure of FIG. 6 and may include all conventionally known structures.

In FIG. 6, the thin film transistors (not shown) are disposed on the substrate SUB in which the display area AA and the non-display area NA have been defined. The data lines DL, the driving current lines VDD, and the ground line VSS simultaneously formed when the thin film transistors (not shown) are formed are disposed on a gate insulating layer GI. A passivation layer PAS is disposed on the data lines DL, the driving current lines VDD, and the ground line VSS. The contact holes CHC through which part of the ground line VSS is exposed is formed in the passivation layer PAS. A planarization layer PL is formed on the passivation layer PAS so that the contact holes CHC through which the ground line VSS is exposed are exposed. The anode electrode ANO connected to the thin film transistors (not shown) are formed on the planarization layer PL. A bank BN configured to cover the edges of the anode electrode ANO and to have most of the anode electrode ANO exposed therethrough is formed on the anode electrode ANO.

The cathode electrode CAT is formed to be opposite the anode electrode ANO. The cathode electrode CAT is configured to fully cover the display area AA and extend in the non-display area NA. The cathode electrode CAT is connected to the ground line VSS through the contact holes CHC. A light-emitting structure is formed between the anode electrode ANO and the cathode electrode CAT.

The light-emitting structure includes a charge generation layer CGL disposed between the anode electrode ANO and the cathode electrode CAT, a first stack STC1 disposed between the charge generation layer CGL and the cathode electrode CAT, and a second stack STC2 disposed between the anode electrode ANO and the charge generation layer CGL.

The charge generation layer CGL is disposed between the first stack STC1 and the second stack STC2 and generates charges. The charge generation layer CGL may have a structure in which a p type charge generation layer and an n type charge generation layer have been stacked. That is, the charge generation layer CGL may include a p type charge generation layer and an n type charge generation layer for generating positive charges and negative charges in both directions and substantially functions as an electrode.

More specifically, the charge generation layer CGL may be a pn junction charge generation layer CGL in which an n type charge generation layer and a p type charge generation layer have been bonded. In this case, the pn junction charge generation layer CGL generates charges or separates charges into holes and electrons and injects the holes and electrons to the respective light-emitting layers. That is, the n type charge generation layer supplies electrons to the second stack STC2 adjacent to the anode electrode ANO and the p type charge generation layer supplies holes to the first stack STC1. Accordingly, emission efficiency of an OLED display including a plurality of the light-emitting layers can be further improved, and a driving voltage can also be lowered.

The n type charge generation layer may be made of metal or an organic substance doped with an n type. In this case, the metal may be one substance selected from the group consisting of Li, Na, K, Rb, Cs, Mg, Ca, Sr, Ba, La, Ce, Sm, Eu, Tb, Dy, and Yb. Furthermore, an n type dopant and host used in the organic substance doped with an n type may be made of a common substance. For example, the n type dopant may be alkali metal, an alkali metal compound, alkali earth metal, or an alkali earth metal compound. The host substance may be an organic substance in which the number of carbons having a hetero ring including nitrogen atoms is 20 to 60. For example, the host substance may be one substance selected from the group consisting of tris(8-hydroxy quinoline) aluminum, triazine, hydroxy quinoline derivatives, benzazole derivatives, and silole derivatives.

The p type charge generation layer may be made of metal or an organic substance doped with a p type. In this case, the metal may include a single alloy or two or more alloys selected from the group consisting of Al, Cu, Fe, Pb, Zn, Au, Pt, W, In, Mo, Ni, and Ti. Furthermore, a p type dopant and host used in the organic substance doped with a p type may be made of a common substance. For example, the p type dopant may be one substance selected from the group consisting of 2,3,5,6-tetraflurorine-7,7,8,8-tetracyanoquinodimethane (F4-TCNQ), the derivatives of tetracyanoquinodimethane, iodine, FeCl3, FeF3, and SbCl5. Furthermore, the host may be one substance selected from the group consisting of N,N'-di(1-naphthyl)-N,N-diphenyl-(1,1'-biphenyl)-4,4'-diamine (NPB), N,N'-bis(3-methylphenyl)-N, N'-bis(phenyl)benzidine (TPD), and N,N,N',N'-tetranaphthalelyl-benzidine (TNB).

The first stack STC1 and the second stack STC2 include one or more organic light-emitting layers EML1 and EML2, respectively, and include common layers COM on and below the organic light-emitting layers EML1 and EML2, respectively. More specifically, the first stack STC1 includes the first organic light-emitting layer EML1, the first common layer COM1 disposed between the cathode electrode CAT and the first organic light-emitting layer EML1, and the second common layer COM2 disposed between the first organic light-emitting layer EML1 and the charge generation layer CGL. The second stack STC2 includes the second organic light-emitting layer EML2, the third common layer COM3 disposed between the charge generation layer CGL and the second organic light-emitting layer EML2, and the fourth common layer COM4 disposed between the second organic light-emitting layer EML2 and the anode electrode ANO.

Each of the first common layer COM1 and the third common layer COM3 includes an electron transport layer ETL. Each of the second common layer COM2 and the fourth common layer COM4 includes a hole transport layer HTL. In some embodiments, the first common layer COM1 may further include an electron injection layer EIL disposed between the electron transport layer ETL and the cathode electrode CAT. Furthermore, the second common layer COM2 may further include a hole injection layer HIL disposed between the charge generation layer CGL and the hole transport layer HTL. The fourth common layer COM4 may further include a hole injection layer HIL disposed between the anode electrode ANO and the hole transport layer HTL. The structure of the common layer COM is not limited to the aforementioned structure and may include all structures capable of improving emission efficiency of the light-emitting structure by activating a flow of holes and electrons.

The first organic light-emitting layer EML1 of the first stack STC1 and the second organic light-emitting layer EML2 of the second stack STC2 may be stacked together to implement red, green, and blue. For example, the first organic light-emitting layer EML1 of red, green, and blue and the second organic light-emitting layer EML2 of red, green, and blue may be stacked in pixel areas PA of red, green, and blue, thus implementing red, green, and blue. In this case, emission substances corresponding to colors to be implemented are selectively coated on the first organic light-emitting layer EML1 and the second organic light-emitting layer EML2 in each pixel area PA.

For example, the first organic light-emitting layer EML1 of the first stack STC1 and the second organic light-emitting layer EML2 of the second stack STC2 may be stacked together to emit white light, and may implement red, green, and blue while passing through color filters (not shown) of red, green, and blue disposed to correspond to the respective red, green, and blue pixel areas PA. For example, the first organic light-emitting layer EML1 emitting yellow-green light and the second organic light-emitting layer EML2 emitting blue light may be stacked to emit white light. In this case, the first organic light-emitting layer EML1 and the second organic light-emitting layer EML2 may be integrated and formed on the entire surface of the substrate SUB.

In an embodiment of the present invention, the two organic light-emitting layers are stacked and formed in each pixel area. In accordance with an embodiment of the present invention, since light is generated by the two organic light-emitting layers formed in each pixel area, an OLED display having high brightness using the same consumption power as that of a single stack structure can be provided, and an OLED display having the same brightness as that of a single stack structure even using low consumption power can be provided. Furthermore, in accordance with an embodiment of the present invention, since the same brightness as that of a single stack structure can be obtained even using a low data voltage, the lifespan of a display device can be improved because the amount of stress applied to a driving element is reduced.

In the OLED display having a double stack structure according to an embodiment of the present invention, in order to prevent a direct contact between the charge generation layer CGL and the cathode electrode CAT, the charge generation layer CGL is formed to have a narrower area than at least one of the common layers COM1 and COM2 of the first stack STC1. That is, in an embodiment of the present invention, at least one of the common layers COM1 and COM2 of the first stack STC1 is disposed to cover the sidewall of the end of the charge generation layer CGL because it is formed to have a wider area than the charge generation layer CGL.

In an embodiment of the present invention, a short circuit of the cathode electrode CAT and the sidewall of the end of the charge generation layer CGL can be prevented because the common layer is also interposed between the cathode electrode CAT and the sidewall of the end of the charge generation layer CGL. That is, a screen abnormality phenomenon in the outskirt part of a panel can be prevented because at least one of the common layers COM1 and COM2 of the first stack STC1 functions as a contact blocking unit for blocking a contact between the cathode electrode CAT and the charge generation layer CGL.

More specifically, if the cathode electrode CAT has a direct contact with the charge generation layer CGL, a driving voltage in the contact area may rise, and thus a screen abnormality phenomenon in the outskirt part of a panel in which the contact area relatively becomes brighter than a peripheral area may be generated because a high load is applied to the contact area. If the cathode electrode CAT and the charge generation layer CGL directly come in contact with each other, a phenomenon in which only the edge of the outskirt party of the display area is brightly seen compared to a peripheral area upon low grayscale driving may occur. In an embodiment of the present invention, an abnormal phenomenon in the outskirt part of a panel can be prevented because the cathode electrode CAT is separated from the sidewall of the end of the charge generation layer CGL in order to prevent a short circuit between the charge generation layer CGL and the cathode electrode CAT.

Figure 7A:
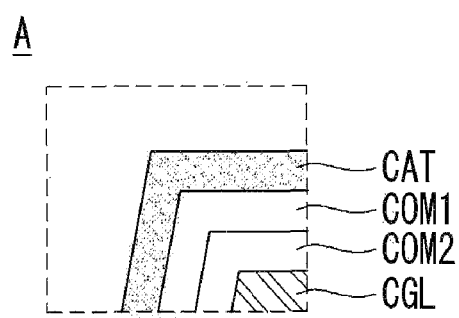
FIGS. 7A and 7B are diagrams showing the stack structure of a cathode electrode, a charge generation layer, and a common layer disposed between the cathode electrode and the charge generation layer according to an embodiment of the present invention.

Examples of various stack structures in which the charge generation layer, the cathode electrode, and the common layer disposed between the charge generation layer and the cathode electrode may be disposed are described with reference to FIGS. 7A and 7B.

For example, as in an area A shown in FIG. 6, the second common layer COM2 may be formed to have a wider area than the charge generation layer CGL and disposed to cover the sidewall of the end of the charge generation layer CGL. In this case, the first common layer COM1 may be formed to have the same area as the second common layer COM2 and disposed over the third common layer COM3. For example, as shown in FIG. 7A, the second common layer COM2 may be formed to have a wider area than the charge generation layer CGL and disposed to cover the sidewall of the end of the charge generation layer CGL. In this case, the first common layer COM1 may be formed to have a wider area than the second common layer COM2 and disposed to cover the sidewall of the end of the second common layer COM2. In this case, an abnormal phenomenon in the outskirt part of a panel can be prevented more effectively because the distance between the cathode electrode CAT and the charge generation layer CGL is further increased.

Figure 7B:
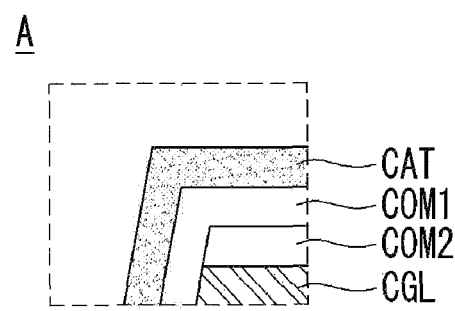

For example, as shown in FIG. 7B, the second common layer COM2 and the charge generation layer CGL may be formed to have the same area. Furthermore, the first common layer COM1 may be formed to have a wider area than the second common layer COM2 and the charge generation layer CGL and may be disposed to cover the sidewalls of the ends of the second common layer COM2 and the charge generation layer CGL. The structure of the light-emitting structure according to an embodiment of the present invention is not limited to these examples and may include all structures in which the common layer is interposed between the cathode electrode CAT and the charge generation layer CGL in order to prevent a direct contact between the cathode electrode CAT and the sidewall of the end of the charge generation layer CGL.

In accordance with an embodiment of the present invention, the OLED display having a double stack structure has been illustrated as being an example, but the present invention is not limited thereto. An embodiment of the present invention may also be applied to an OLED display having a multi-layer stack structure including three or more layers. That is, an embodiment of the present invention may be applied to all structures in which a common layer is interposed between the cathode electrode and the charge generation layers disposed between stack structures so that the charge generation layers do not have a direct contact with the cathode electrode in an OLED display having a multi-layer stack structure.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light-emitting diode (OLED) display, comprising:
   an anode electrode disposed over a substrate;
   a cathode electrode disposed opposite the anode electrode;
   a charge generation layer disposed between the anode electrode and the cathode electrode;
   a first stack disposed between the charge generation layer and the cathode electrode and configured to comprise a first organic light-emitting layer, a first common layer disposed over the first organic light-emitting layer, and a second common layer disposed under the first organic light-emitting layer; and
   a second stack disposed between the charge generation layer and the anode electrode,
   wherein at least one of the first common layer and the second common layer covers a sidewall of the charge generation layer.

2. The OLED display of claim 1, wherein the sidewall of the charge generation layer is separated from the cathode electrode with at least one of the first common layer and the second common layer interposed between the charge generation layer and the cathode electrode.

3. The OLED display of claim 1, wherein the first common layer and the second common layer cover the sidewall of the charge generation layer.

4. The OLED display of claim 1, wherein the second stack comprises:
   a second organic light-emitting layer,
   a third common layer disposed over the second organic light-emitting layer, and
   a fourth common layer disposed under the second organic light-emitting layer.

5. The OLED display of claim 4, wherein each of the first common layer and the third common layer comprises an electron transport layer.

6. The OLED display of claim 4, wherein each of the second common layer and the fourth common layer comprises a hole transport layer.

7. The OLED display of claim 1, wherein the second common layer is disposed on a portion of the charge generation layer,
   wherein the first common layer is disposed on the charge generation layer to cover the second common layer, and
   wherein the cathode electrode is disposed on the first common layer.

8. The OLED display of claim 1, wherein the second common layer is disposed on the charge generation layer,
   wherein the first common layer is disposed on a portion of the second common layer, and
   wherein the cathode electrode is disposed on the second common layer to cover the first common layer.

9. The OLED display of claim 1, wherein the second common layer is disposed on the charge generation layer,
   wherein the first common layer is disposed on the second common layer, and
   wherein the cathode electrode is disposed on the first common layer.

10. An organic light-emitting diode (OLED) display, comprising:
    an anode electrode disposed over a substrate; a lower stack disposed over the anode electrode; a charge generation layer disposed over the lower stack; an upper stack disposed over the charge generation layer; a cathode electrode disposed over the upper stack; and
    a contact blocking unit interposed between the cathode electrode and a sidewall at an end of the charge generation layer,
    wherein the sidewall at the end of the charge generation layer is separated from the cathode electrode with the contact blocking unit interposed between the sidewall at the end of the charge generation layer and the cathode electrode.

11. The OLED display of claim 10, wherein:
    the upper stack comprises a first organic light-emitting layer, a first common layer disposed over the first organic light-emitting layer, and a second common layer disposed under the first organic light-emitting layer, and the contact blocking unit comprises at least one of the first common layer and the second common layer.

12. The OLED display of claim 10, wherein the lower stack comprises:
a second organic light-emitting layer,
a third common layer disposed over the second organic light-emitting layer, and
a fourth common layer disposed under the second organic light-emitting layer.

* * * * *